US007072166B2

United States Patent
Qin et al.

(10) Patent No.: US 7,072,166 B2
(45) Date of Patent: Jul. 4, 2006

(54) CLAMPING AND DE-CLAMPING SEMICONDUCTOR WAFERS ON A J-R ELECTROSTATIC CHUCK HAVING A MICROMACHINED SURFACE BY USING FORCE DELAY IN APPLYING A SINGLE-PHASE SQUARE WAVE AC CLAMPING VOLTAGE

(75) Inventors: Shu Qin, Malden, MA (US); Peter L. Kellerman, Essex, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 469 days.

(21) Appl. No.: 10/661,180

(22) Filed: Sep. 12, 2003

(65) Prior Publication Data

US 2005/0057881 A1    Mar. 17, 2005

(51) Int. Cl.
*H01H 1/00* (2006.01)
(52) U.S. Cl. .................................. 361/234
(58) Field of Classification Search ........... 361/234
See application file for complete search history.

(56) References Cited

U.S. PATENT DOCUMENTS

| | | | |
|---|---|---|---|
| 3,566,959 | A | 3/1971 | Koltuniak et al. |
| 4,788,627 | A | 11/1988 | Ehlert et al. |
| 5,103,367 | A | 4/1992 | Horwitz et al. |
| 5,117,121 | A | 5/1992 | Watanabe et al. |
| 5,155,652 | A | 10/1992 | Logan et al. |
| 5,325,261 | A | 6/1994 | Horwitz |
| 5,444,597 | A | 8/1995 | Blake et al. |
| 5,452,177 | A | 9/1995 | Frutiger |
| 5,583,736 | A | 12/1996 | Anderson et al. |
| 5,810,933 | A | 9/1998 | Mountsier et al. |
| 5,838,529 | A | 11/1998 | Shufflebotham et al. |
| 5,880,922 | A | 3/1999 | Husain |
| 5,880,924 | A * | 3/1999 | Kumar et al. ............ 361/234 |

(Continued)

FOREIGN PATENT DOCUMENTS

JP    10-284583 A    10/1998

Primary Examiner—Brian Sircus
Assistant Examiner—Boris Benenson
(74) Attorney, Agent, or Firm—Eschweiler & Associates, LLC

(57) ABSTRACT

The present invention is directed to a method and a system for clamping a wafer to a J-R electrostatic chuck using a single-phase square wave AC clamping voltage. The method comprises determining a single-phase square wave clamping voltage for the J-R electrostatic chuck, wherein the determination is based, at least in part, on a minimum residual clamping force associated with the wafer and the electrostatic chuck and a surface topography of a leaky dielectric layer associated therewith. The wafer is placed on the electrostatic chuck; and the determined clamping voltage is applied to the electrostatic chuck, therein electrostatically clamping the wafer to the electrostatic chuck, wherein at least the minimum residual clamping force is maintained during a polarity switch of the single-phase square wave clamping voltage. The determination of the surface topography comprises a first gap and a second gap between the wafer and the electrostatic chuck and an island area ratio, wherein a difference in RC time constants associated with the respective first gap and second gap is provided such that at least the minimum residual clamping force is maintained during the polarity switch. Upon removal of the square wave clamping voltage, the de-clamping time is substantially reduced, and corresponds to the pulse width of the square wave clamping voltage.

27 Claims, 7 Drawing Sheets

U.S. PATENT DOCUMENTS

| | | |
|---|---|---|
| 5,916,689 A | 6/1999 | Collins et al. |
| 5,958,813 A | 9/1999 | Aida et al. |
| 6,077,357 A | 6/2000 | Rossman et al. |
| 6,117,246 A | 9/2000 | Parkhe et al. |
| 6,149,774 A | 11/2000 | Sun et al. |
| 6,215,643 B1 | 4/2001 | Nagasaki |
| 6,236,555 B1 * | 5/2001 | Leeser ................ 361/234 |
| 6,378,600 B1 | 4/2002 | Moslehi |
| 6,388,861 B1 | 5/2002 | Frutiger |
| 6,414,834 B1 | 7/2002 | Weldon et al. |
| 6,452,775 B1 | 9/2002 | Nakajima |
| 6,905,984 B1 * | 6/2005 | Kellerman et al. ......... 438/597 |
| 6,946,403 B1 * | 9/2005 | Kellerman et al. ......... 438/758 |
| 2002/0173059 A1 | 11/2002 | Ma |

\* cited by examiner

CLAMPING AND DE-CLAMPING SEMICONDUCTOR WAFERS ON A J-R ELECTROSTATIC CHUCK HAVING A MICROMACHINED SURFACE BY USING FORCE DELAY IN APPLYING A SINGLE-PHASE SQUARE WAVE AC CLAMPING VOLTAGE

RELATED APPLICATIONS

This application is related to U.S. application Ser. No. 10/657,449, filed on Sep. 8, 2003 (Now U.S. Pat. No. 6,947,274), entitled, "Clamping and De-clamping Semiconductor Wafers on an Electrostatic Chuck Using Wafer inertial Confinement by applying a Single-Phase square wave AC Clamping Voltage", which is incorporated herein in its entirety.

FIELD OF THE INVENTION

The present invention relates generally to semiconductor processing systems, and more specifically to a method and system for clamping a wafer to a Johnsen-Rahbek electrostatic chuck by applying a single-phase square-wave AC clamping voltage.

BACKGROUND OF THE INVENTION

Electrostatic chucks (ESCs) have been utilized in plasma-based or vacuum-based semiconductor processes such as etching, CVD, and ion implantation, etc. for a long time. Capabilities of the ESCs, including non-edge exclusion and wafer temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., plasma processing), a clamping voltage is typically applied between the wafer and the electrode, wherein the wafer is clamped against the chuck surface by electrostatic forces. Furthermore, the wafer can be cooled by introducing a gas, such as helium, and applying backpressure between the wafer and the dielectric layer. A temperature of the wafer can then be controlled by adjusting the backpressure between the wafer and the dielectric layer.

Declamping or un-sticking the wafer from the chuck surface, however, is a concern in many ESC applications. For example, after the clamping voltage is turned off, the wafer typically "sticks" to the chuck surface for a considerable amount of time, wherein the wafer cannot be removed by typical wafer lifting mechanisms (e.g., pins extending through the ESC which are operable to lift the wafer from the surface of the dielectric layer). This wafer declamping problem can reduce the throughput of the process. It is believed that the wafer-declamping problem occurs when residual charges induced by the clamping voltage remain on the dielectric layer or on a surface of the wafer, therein leading to an undesirable electric field and clamping force. According to a charge migration model, residual charges are caused by charge migration and accumulation during clamping, wherein the charges accumulate at the dielectric surface and/or wafer backside (e.g., when the wafer surface comprises an insulating layer).

An RC time constant, for example, can be used to characterize the charge/discharge times which correspond to an amount of time typically required to respectively clamp or de-clamp the wafer. This time constant is determined by the product of a volume resistance of the dielectric layer and a gap capacitance between the wafer and dielectric surfaces, i.e., $$RC = R_{die} C_{gap} = \rho(\text{dielectric}) \varepsilon_0 \varepsilon_r \frac{d(\text{dielectric})}{\text{gap}} \quad (1)$$

where $R_{die}$ is the resistance of the dielectric layer, $C_{gap}$ is the capacitance of the gap between the wafer and the chuck surface, $\rho(\text{dielectric})$ is the volume resistivity of the dielectric layer, $\varepsilon_0$ is the free space permittivity, $\varepsilon_r$ is the dielectric constant of the gap, $d(\text{dielectric})$ is the thickness of the dielectric layer, and gap is the distance between the dielectric and wafer surfaces. For example, for a typical flat-plate ESC, if we assume that $\rho(\text{dielectric})=10^{15}$ Ω-cm, $\varepsilon_0 = 8.85 \times 10^{-14}$ F/cm, $\varepsilon_r = 1$, $d(\text{dielectric})=0.2$ mm, and gap=3 μm, we find RC=5900 seconds. This is a fairly long charging/discharging time, meaning that if clamping is longer than 5900 seconds, the declamping time will also last approximately 5900 seconds.

A variety of techniques have been previously disclosed for reducing wafer de-clamping problems encountered in the use of ESCs. For example, one conventional technique involves applying a reversal voltage before the wafer is removed from the ESC, therein eliminating a residual attractive force. This reversal voltage, however, is typically 1.5 to 2 times higher than the clamping voltage, and the de-clamping time is still typically quite large. Another conventional technique involves providing a low-frequency sinusoidal AC voltage in order to produce sine wave fields of controlled amplitude and phase. Such low-frequency sinusoidal AC voltages, however, typically provide low clamping forces, as well as fairly long residual clamping times.

Johnsen-Rahbek (J-R) effect-type ESCs have also been developed in order to minimize the de-clamping problem, wherein a purposely "leaky" dielectric is utilized such that the residual charges can be discharged more quickly. For example, if the resistivity of the dielectric $R_{die}$ can be controlled to approximately $10^9$ Ω-cm, by using Equation (1) and the above conditions, the clamping/de-clamping time can be reduced to approximately 0.0059 seconds. J-R type ESCs, for example, have been found to be effective in minimizing the de-clamping problem for bare Si wafers. However, both experiments and models indicate that a de-clamping problem is still evident for wafers having a backside insulator.

For wafers having a backside insulator, a typical de-clamping time is generally between 5 and 50 seconds, depending, at least in part, on a thickness of the backside insulator, a volume resistivity of the backside insulator, as well as surface conditions of the chuck. FIG. 1, for example, is a graph 10 illustrating a de-clamping time (RC time constant) versus thickness of the backside insulating layer for a typical J-R type ESC of the prior art. The graph 10 illustrates an exemplary gap of 1 μm (curve 15) and 4.5 μm (curve 20) between the wafer and dielectric. As can be seen, for a varying gap, when the backside insulating layer is approximately 2 kÅ, for example, the de-clamping time can generally range between approximately 4 and 20 seconds. Such large wafer de-clamping times can be costly when processing time and throughput are a concern.

Wafer de-clamping problems in J-R type ESCs are typically caused, at least in part, by charge migrating and accumulating to the backside insulator surface of the wafer. The de-clamping time can be characterized by the charging/discharging time constant, as shown in Equation (1), and the de-clamping time is typically proportional to the clamping time for the ESC. Currently, however, no acceptable solution for the de-clamping problem of J-R-type ESCs for Si wafers having a backside insulator appears to exist.

Therefore, a need exists in the art for an improved clamping and declamping system and method for J-R-type ESCs which take into account physical and electrical properties of both a semiconductor wafer having a backside insulator and the ESC.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

Challenges of the prior art are overcome in the present invention by applying a single-phase square-wave AC voltage to a Johnsen-Rahbek (J-R) electrostatic chuck (ESC) to clamp and de-clamp a semiconductor wafer having a backside insulator layer, wherein a polarity of the square-wave voltage, for example, is determined and controlled, based, at least in part, on a surface topography of the ESC and a minimum residual clamping force associated therewith. The present invention utilizes a relatively simple and inexpensive apparatus, in comparison with various conventional electrostatic chucks. As opposed to some conventional techniques that attempt to remove a residual charge as quickly as possible, the method and system of the present invention are designed to generally prevent the residual charge from being generated in the first place.

According to one exemplary aspect of the present invention, the method is referred to as "force delay", and comprises determining a square wave single-phase AC clamping voltage to be applied to a J-R type ESC. De-clamping time can be minimized by adjusting a pulse width and a pulse magnitude of the applied voltage, as well as adjusting the surface topography of the ESC. A micro-machined J-R type ESC can be employed, wherein a gap differential is employed between the wafer and the ESC, and wherein the topography of the ESC can be precisely controlled and adjusted, therein generally permitting a precise determination of a waveform of the clamping voltage.

According to another exemplary aspect of the invention, the wafer can be almost instantaneously de-clamped after the clamping voltage is turned off, due, at least in part, to the pulse width during clamping being short enough to significantly prevent charge migration and accumulation to a dielectric front surface and/or back surface of the wafer. According to another exemplary aspect of the invention, the ESC may comprise electrode patterns of various types, including, for example, a simple uni-polar structure for a plasma-environment system or a simple D-shape bi-polar structure for a vacuum-environment system. Furthermore, the present invention does not require complicated electrode patterns or complex signal timing control electronics.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
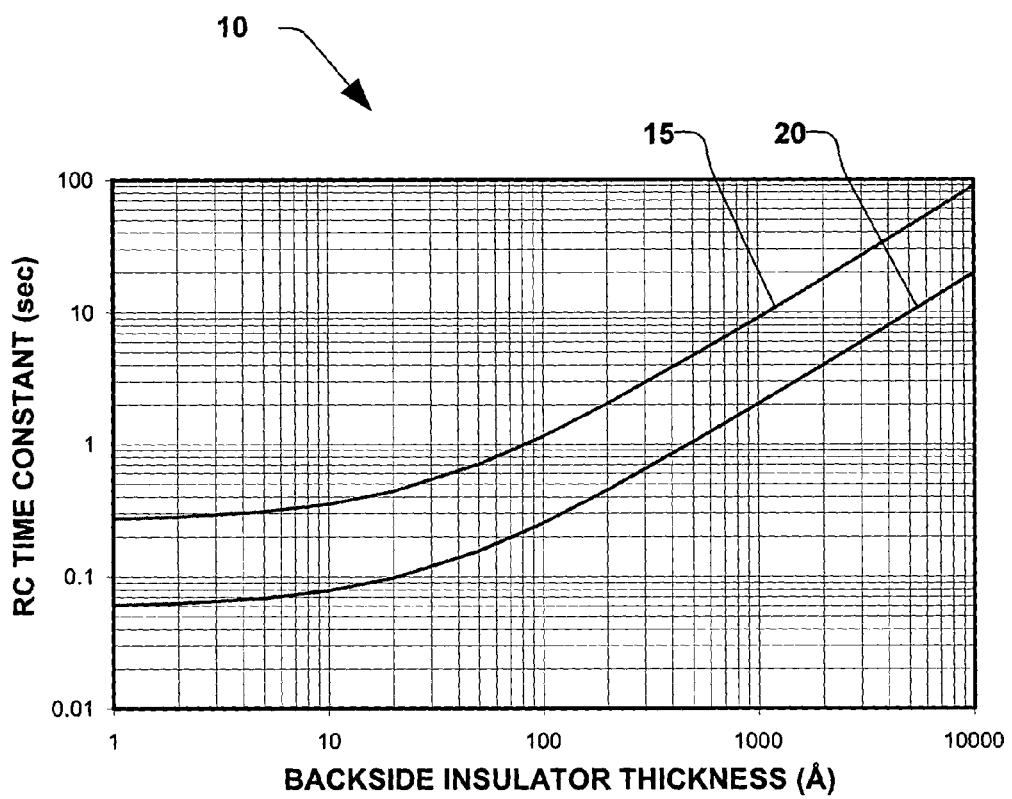
FIG. 1 is a graph illustrating an exemplary de-clamping time versus backside insulator thickness for a J-R type electrostatic chuck of the prior art.

The present invention is generally directed towards a method and a system for clamping and de-clamping a wafer having a backside insulating layer utilizing a Johnsen-Rahbek (J-R) type electrostatic chuck (ESC), wherein a determined single-phase square wave AC clamping voltage is applied to the ESC, therein selectively clamping the wafer thereto. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Conventionally, J-R type ESCs have been developed in order to minimize de-clamping problems associated with electrostatic clamping of bare semiconductor wafers. By utilizing a dielectric layer comprised of "leaky" dielectric material on a surface of the ESC, electrostatic charges which accumulate at the dielectric layer of the ESC can naturally "leak", or discharge from the dielectric layer, thereby shortening a de-clamping time. However, both observation and theory indicate that when clamping a wafer having a backside insulating layer (e.g., $SiO_2$), the de-clamping time for the wafer can be quite long, wherein the long de-clamping time is attributed to a removal of residual charges that have migrated and accumulated at the insulating layer on wafer.

Figure 2:
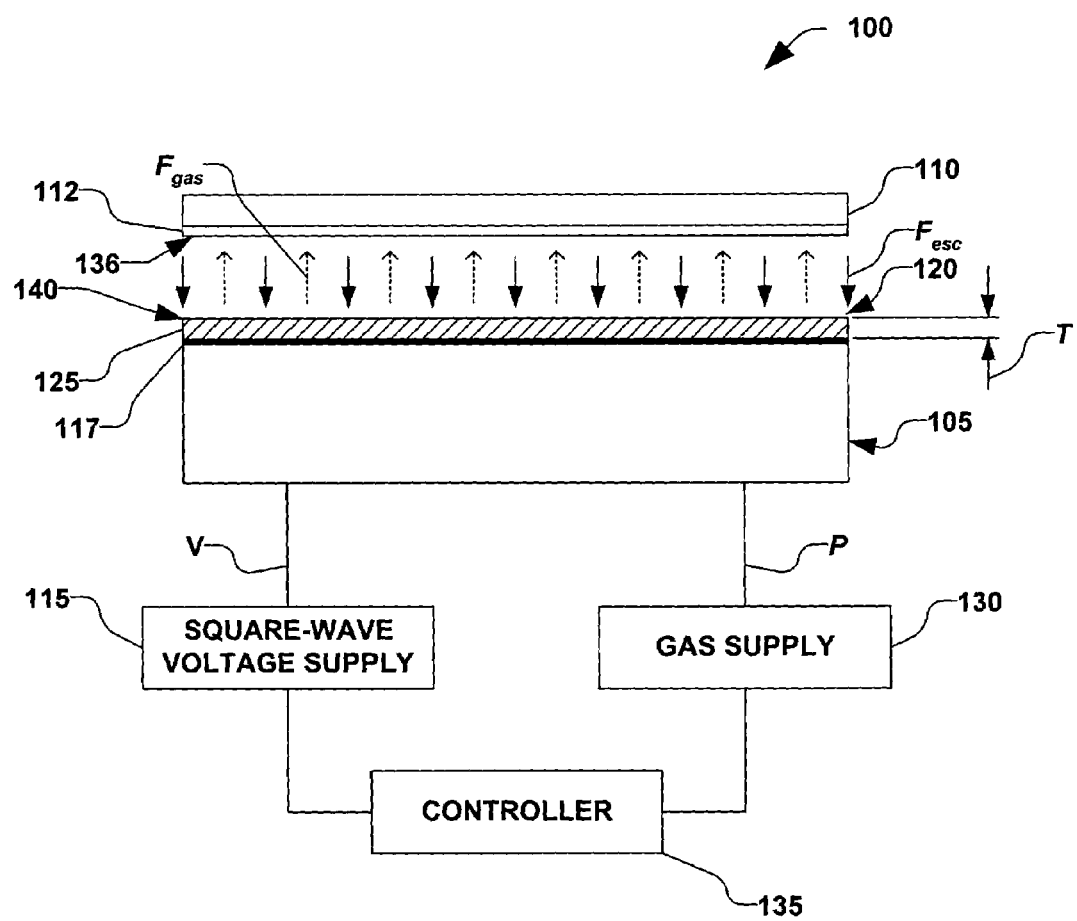
FIG. 2 is a system-level block diagram of an exemplary J-R electrostatic chuck according to one aspect of the present invention.

The present invention overcomes conventional challenges of de-clamping wafers having backside insulating layers by providing a relatively simple and inexpensive method and system for clamping and de-clamping the wafers utilizing a single-phase square wave clamping voltage. Referring now to the drawings, FIG. 2 illustrates a block diagram of an exemplary clamping system 100, wherein the clamping system comprises a J-R type electrostatic chuck 105 for selectively clamping a wafer 110 having a backside insulating layer 112 thereto. The system 100, for example, comprises a voltage source 115 which is operable to selectively provide a voltage potential V to one or more electrodes 117 of the ESC 105, wherein the voltage potential is operable to selectively electrostatically clamp the wafer 110 to a surface 120 of the ESC by inducing an electrostatic clamping force $F_{esc}$ between the ESC and the wafer 110. The ESC 105, for example, further comprises a leaky dielectric layer 125 wherein the leaky dielectric layer is operable to discharge electrostatic charges associated therewith at a predetermined rate.

The system 100, for example, further comprises a gas supply 130 operable to provide a backside gas pressure P (also referred to as the cooling gas backpressure force $F_{gas}$) to the wafer 110. The gas supply 130, for example, is operable to provide a cooling gas (not shown), such as helium, between the surface 120 of the ESC 105 and the wafer 110. The system 100 further comprises a controller 135, wherein the controller is operable to control the pressure P of the cooling gas, wherein the control of the pressure, for example, is further operable to control an amount of heat transfer between the ESC 105 and the wafer 110. The controller 135, for example, is further operable to control the application of the clamping voltage V to the ESC 105 by controlling the voltage source 115 (e.g., a power supply).

The voltage source 115, according to one exemplary aspect of the present invention, is operable to provide a single-phase square wave AC clamping voltage V to the ESC 105, wherein the square wave clamping voltage is generally defined by a pulse width, a pulse repetition frequency (prf), and pulse magnitude. A de-clamping time can be characterized by a charging/discharging RC time constant, as shown in Equation (1) above, wherein the de-clamping time is generally proportional to the clamping time for the ESC 105. However, according to the present invention, applying the single-phase square wave AC signal as a clamping voltage V, wherein the clamping voltage has a sufficiently short pulse width, residual charges have little to no time to migrate and accumulate on a backside surface 136 of the insulating layer 112 on the wafer 110, therein substantially eliminating the de-clamping problem discussed above. In other words, the de-clamping time can be reduced to approximately the pulse width of the clamping voltage. Therefore, by adjusting the pulse width (and, for example, the pulse repetition frequency), the de-clamping time can be determined and selected such that it is short enough to satisfy throughput specifications of semiconductor processes being performed.

In providing a single-phase square wave clamping voltage V to the ESC 105, however, the clamping voltage V switches polarities (e.g., the clamping voltage V crosses 0 volts with a change rate versus time, as characterized by a rise-time of a voltage pulse), and the electrostatic clamping force $F_{esc}$ can possibly fall to zero, thus allowing a possibility that the wafer 110 may be "lost" due to gas backpressure $F_{gas}$ or other forces, such as gravity (not shown) if the ESC is oriented upside down. The present invention, however, advantageously clamps the wafer 110 and balances the electrostatic clamping force $F_{esc}$ across the wafer when the clamping voltages V cross 0 volts, by providing a gap differential between the wafer and the ESC 105 across the wafer.

Accordingly, with respect to one exemplary aspect of the present invention, a "force delay" can be utilized in the J-R ESC 105 in order to substantially resolve clamping and de-clamping problems typically associated with wafers having a backside insulating layers. "Force delay", for example, employs the single-phase square wave AC clamping voltage V applied to the one or more electrode 117 of either a uni-polar or multi-polar electrode J-R type ESC 105, wherein the clamping voltage is operable to predictably clamp and de-clamp the wafer 110, for example, by adjusting the pulse width and pulse magnitude of the clamping voltage, in accordance with a topography of the chuck surface 120. By utilizing "force delay", an average non-zero clamping force $F_{esc}$ is placed on the wafer 110 during polarity switching (as the voltage crosses 0 volts) due to a non-homogeneous topography of the chuck surface 120, wherein a gap between the chuck surface 120 and the wafer is substantially varied.

Figure 3:
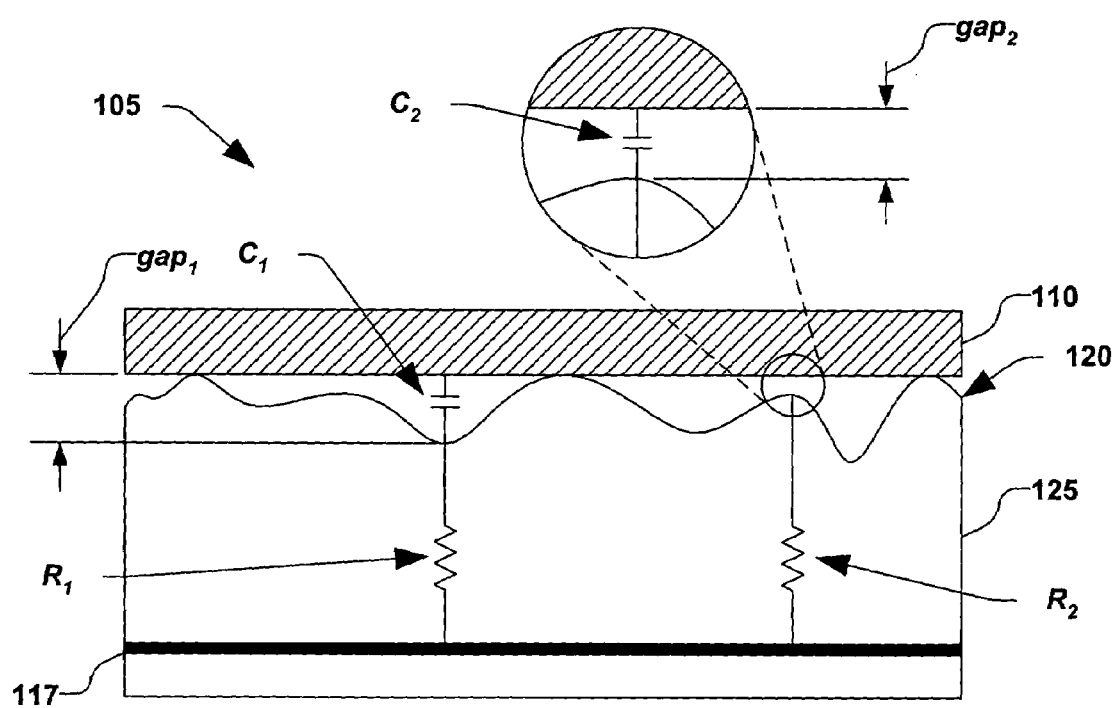
FIG. 3 is a partial cross-sectional view of an exemplary ESC comprising a roughened leaky dielectric layer according to another aspect of the present invention.

For example, a partial view of the exemplary ESC 105 is illustrated in cross-section in FIG. 3, wherein the chuck surface 120 comprises varying gap spaces $gap_1$, $gap_2$. . . $gap_N$ between the dielectric layer 125 and the wafer 110. The varying gap spaces, for example, cause varying RC time constants, or delays, resulting from the voltages $V_1$, $V_2$. . . $V_N$ at each point N across the surface 120. A net clamping force (e.g., a minimum residual clamping force) across the entire wafer 110, for example, can be calculated, and the resulting net clamping force may be non-zero during polarity switching, due, at least in part, to the clamping voltages having different RC time delays across the wafer. Accordingly, by controlling parameters such as the pulse width, pulse repetition frequency (prf), and pulse magnitude of the single-phase square wave AC clamping voltage V, as well as by controlling the topography of the chuck surface 120, the wafer 110 can be reliably clamped during polarity switching due, at least in part, to the minimum residual clamping force.

The minimum residual clamping force during voltage polarity switching can be optimized, according to another exemplary aspect of the present invention, by controlling the surface topography of the ESC 105. For example, the surface 140 of the leaky dielectric layer 125 can be micro-machined, wherein the micro-machined clamp surface 120 provides greater differences in gap distances, thus providing greater differences in RC time constants. Alternatively, the leaky dielectric layer 125 can be machined using other conventional machining methods, thereby providing greater differences in gap distances.

Figure 4:
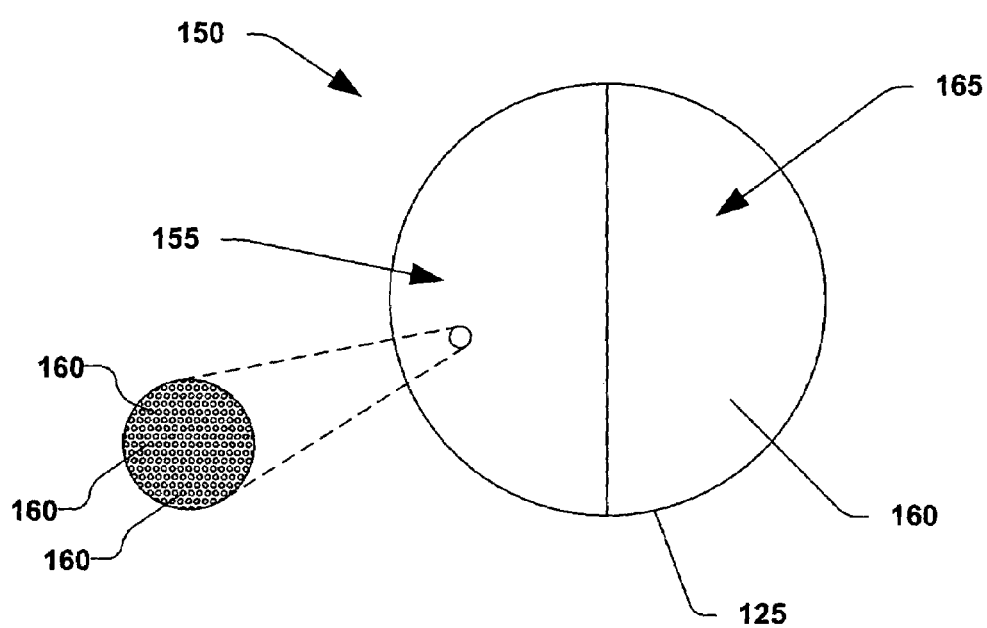
FIG. 4 is a plan view of an exemplary ESC comprising a micro-machined leaky dielectric layer according to yet another aspect of the present invention.

According to another exemplary aspect of the present invention, FIG. 4 illustrates a plan view of an exemplary ESC 150 comprising a micro-machined surface 155. The surface 155 of the ESC 150, for example, comprises a plurality of microstructures or islands 160, wherein the plurality of islands generally extend outwardly from a surface 165 of the leaky dielectric layer 125. The plurality of islands 160, for example, are illustrated as circular islands, however the plurality of islands can be any shape, such as squares, rectangles, concentric rings, etc., and all such shapes are contemplated as falling within the scope of the present invention. The minimum residual clamping force during voltage switching, for example, can therefore be reliably controlled by adjusting the pulse magnitude of the square wave clamping voltage V and the surface topography of the ESC surface 155, including, but not limited to, adjusting island heights, and island area ratios associated with the leaky dielectric layer 125.

Figure 5:
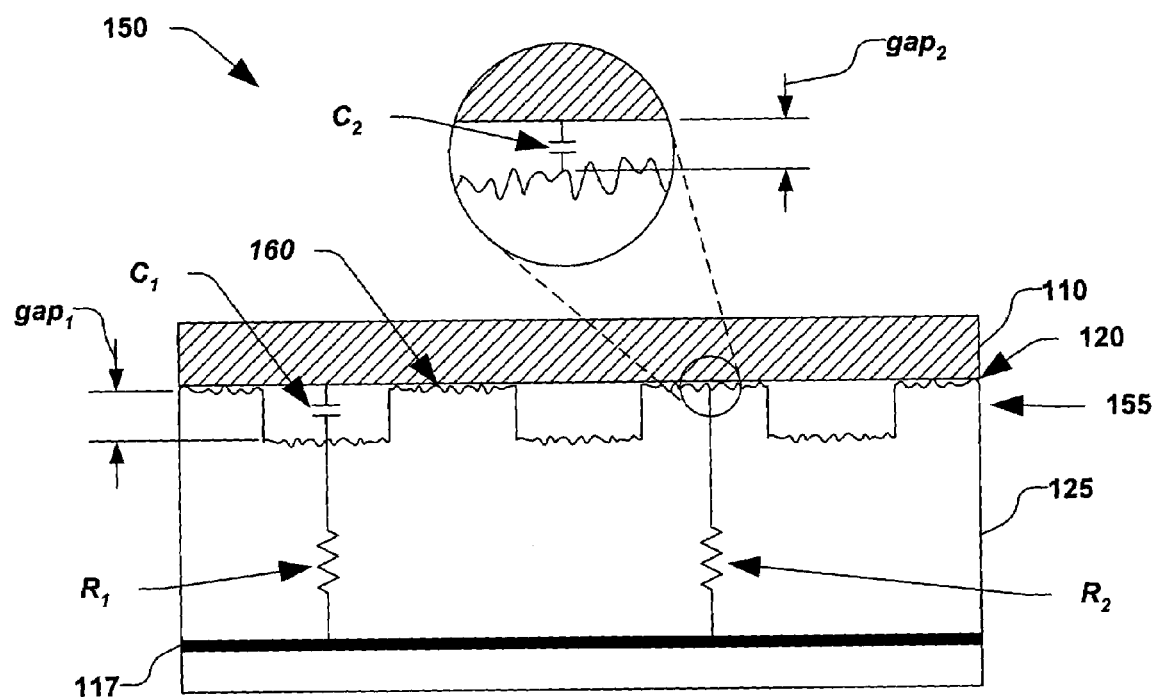
FIG. 5 is a partial cross-sectional view of an exemplary ESC comprising a micro-machined leaky dielectric layer according to still another aspect of the present invention

For example, FIG. 5 illustrates a cross-section of the micro-machined ESC 150 comprising the plurality of islands 160, as illustrated previously in FIG. 4. For example, the micro-machined surface 155 of FIG. 5 illustrates a first gap ($gap_1$) and a second gap ($gap_2$), wherein $gap_1$ is generally based on a height of the islands 160 formed in the leaky dielectric layer 125, and $gap_2$ is defined by a surface condition of a top surface of the island. A height of the islands (e.g., a height of approximately 3 μm), for example, can be considered negligible in contrast to a total thickness T of the dielectric layer 125 (e.g., approximately 1 mm), therefore, a volume resistance $R_1$ associated with the island 160 can be assumed to be approximately equal to a volume resistance $R_2$ of the top surface. A capacitance $C_1$ of $gap_1$, however, can be significantly smaller than a capacitance $C_2$ of $gap_2$, due to a significant difference in gap distances. The corresponding RC constants, in this example, are $$RC_1 = \rho\varepsilon_0 \frac{d(\text{dielectric})}{gap_1} = 0.066 \text{ sec}, \quad (2)$$

$$RC_2 = \rho\varepsilon_0 \frac{d(\text{dielectric})}{gap_2} = 0.266 \text{ sec}, \quad (3)$$

where, ρ(dielectric) is the volume resistivity of the dielectric layer (e.g., ρ(dielectric)=3×10$^9$ Ω-cm), $\varepsilon_0$ is the free space permittivity (e.g., $\varepsilon_0$=8.85×10$^{-14}$ F/cm), and d(dielectric) is the thickness of the dielectric layer. For purposes of the above example, d(dielectric)=1 mm, $gap_1$=4 μm, and $gap_2$=1 μm.

According to one example, $gap_1$ is at least twice as large as $gap_2$, wherein a differential between gap distances provides a corresponding differential between the capacitance of the gaps. According to another example, $gap_1$ is at least three times as large as $gap_2$. A substantially large gap differential (e.g., $gap_1$=4 μm and $gap_2$=1 μm) provides a substantially large capacitance differential between the gaps, thereby providing a substantially large and advantageous RC time constant differential.

Figure 6:
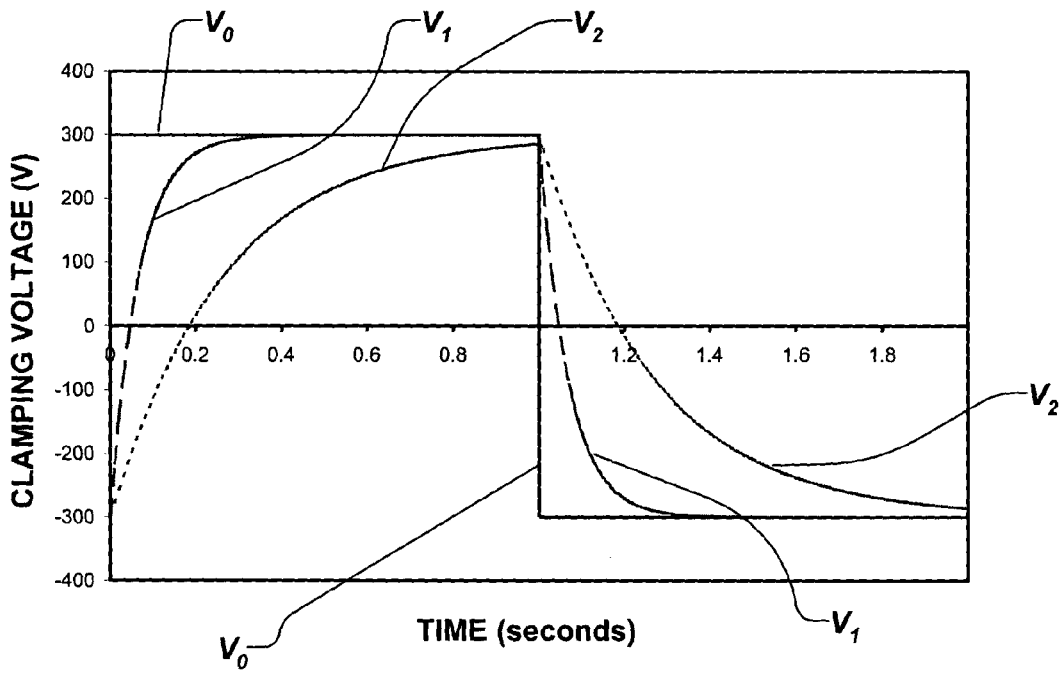
FIG. 6 is a graph illustrating waveforms of clamping voltage as a function of time for an exemplary ESC according to another aspect of the present invention.

FIG. 6 illustrates exemplary waveforms of the above exemplary clamping voltages applied to the electrode, $gap_1$, and $gap_2$, respectively, assuming $V_0$ is the applied clamping voltage and is a perfect square wave pulse, and $V_1$ and $V_2$ are delayed by $RC_1$ and $RC_2$ time constants, respectively. The clamping voltages V as a function of time t, for example, are delayed by an exponentially decaying function indicated by $$V(t)=V_0(1-2e^{-t/RC}). \quad (4)$$

As shown in FIG. 6, the exemplary clamping voltages $V_1(t)$ and $V_2(t)$ cross 0 volts with a different time delay when $V_0$ switches polarity.

Figure 7:
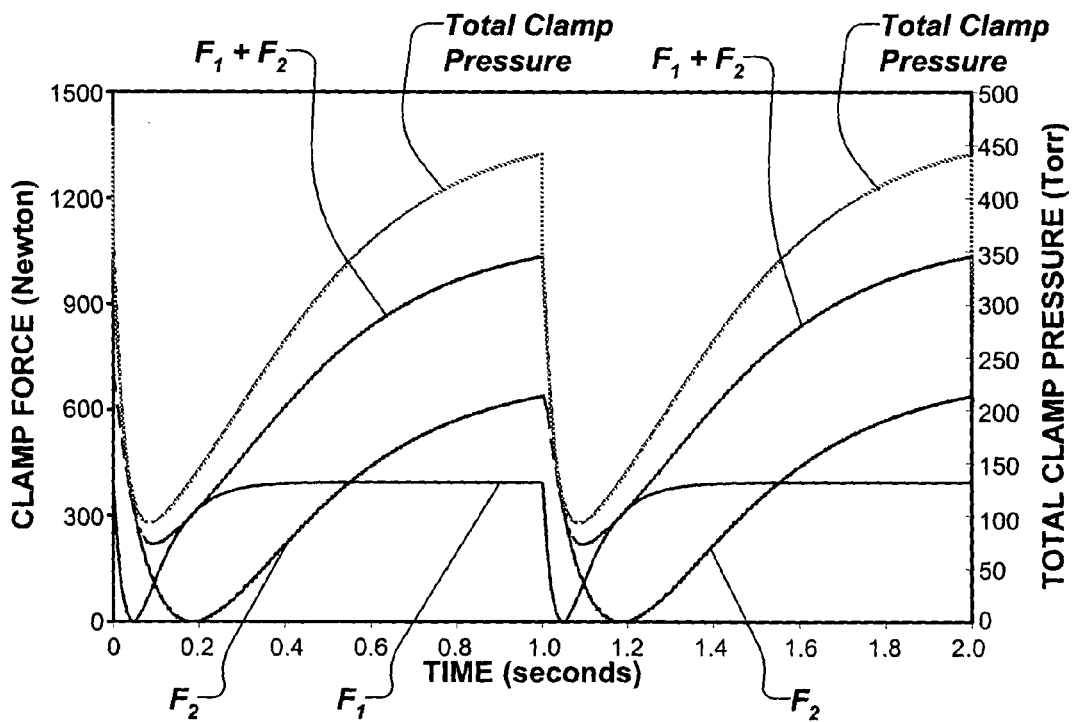
FIG. 7 is a graph illustrating waveforms of clamping force and total clamping pressure as a function of time for an exemplary ESC according to another aspect of the present invention.

FIG. 7 illustrates the above exemplary clamping forces $F_1(t)$ and $F_2(t)$, and a total clamping force $F_{tot}$, wherein clamping forces are calculated by $$F_1(t) = \frac{A_1}{2}\varepsilon_0\left(\frac{V_1(t)}{gap_1}\right)^2, \text{ and} \quad (5)$$

$$F_2(t) = \frac{A_2}{2}\varepsilon_0\left(\frac{V_2(t)}{gap_2}\right)^2, \quad (6)$$

where $A_1$ is a total chuck surface area minus an area encompassed by the plurality of islands, and $A_2$ is the island surface area. The total clamping force, consequently, is $F(t)=F_1(t)+F_2(t)$.

According to another exemplary aspect of the invention, a minimum residual clamping force is defined by a minimum force at which the wafer remains clamped the ESC. As illustrated in FIG. 7, an exemplary 6 inch (150 mm) diameter silicon wafer is clamped, wherein a total minimum residual clamping pressure (e.g., the minimum residual clamping force over an area of the wafer) can be up to approximately 100 Torr under the above conditions when $V_0$ switches polarity. Consequently, the minimum residual clamping pressure (e.g., the minimum residual clamping force per unit area) during $V_0$ switching can be reliably controlled by adjusting a pulse magnitude of $V_0$, as well as by controlling the surface topography, such as island heights (e.g., as related to RC time constants) and the area ratio (e.g., as related to force components). For example, if an area ratio of the islands to the chuck surface is 0.1, $gap_1$=4 μm, and $gap_2$=1 μm, when the magnitude of $V_0$ is ±300, 400, and 500 V, the minimum residual clamping pressure during $V_0$ polarity switches is 94, 170, and 260 Torr, respectively. Alternatively, if $V_0$ is approximately ±300 volts, the island area ratio is 0.1, $gap_1$=4 μm, and $gap_2$=1, 0.8, and 0.5 μm, the minimum residual clamping pressure during $V_0$ switches is 94, 140, and 170 Torr, respectively. In another example, if $V_0$ is approximately ±300 V, $gap_1$=4 μm, $gap_2$=1 μm, and the island area ratios are 0.05, 0.1, and 0.2, the minimum residual clamping pressure during $V_0$ switches is 60, 94, and 110 Torr, respectively. As can be seen by the above examples, clamping voltage and surface topography of the leaky dielectric layer can provide a vast ability to "tune" the ESC, such that the wafer will remain clamped during polarity switches.

According to another exemplary aspect of the invention, the pulse magnitude of the clamping voltage V should be high enough to induce the required minimum residual clamping force, and the clamping voltage should also be higher than a backside gas pressure requirement which achieves reliable clamping and cooling. For example, if a clamping voltage V of ±300 volts is required to achieve a minimum 100 Torr clamping pressure, the de-clamping time can be controlled to less than or equal to approximately 1 sec by adjusting the pulse width to less than or equal to approximately 1 sec. The pulse rise-time of the AC signal can vary, but should be as short as possible. Accordingly, in one example, a 5 μsec or shorter rise-time provides adequate control of the process, and such voltage supplies can be easily found in the marketplace, either using MOSFET or IGBT technology, for example.

In accordance with another exemplary aspect of the present invention, the ESC 105 of FIG. 2 may further comprise electrode patterns of various types, including, for example, a simple uni-polar structure for a plasma-environment system or a simple D-shape bi-polar structure for a vacuum-environment system. Furthermore, the present invention does not require complicated electrode patterns or complex signal timing control electronics. The wafer 110 can be almost instantaneously de-clamped after the clamping voltage V is turned off, due, at least in part, to the pulse width during clamping being short enough to significantly limit or prevent charge migration and accumulation to the leaky dielectric layer 125 and/or the insulating layer 112 of the wafer 110.

Figure 8:
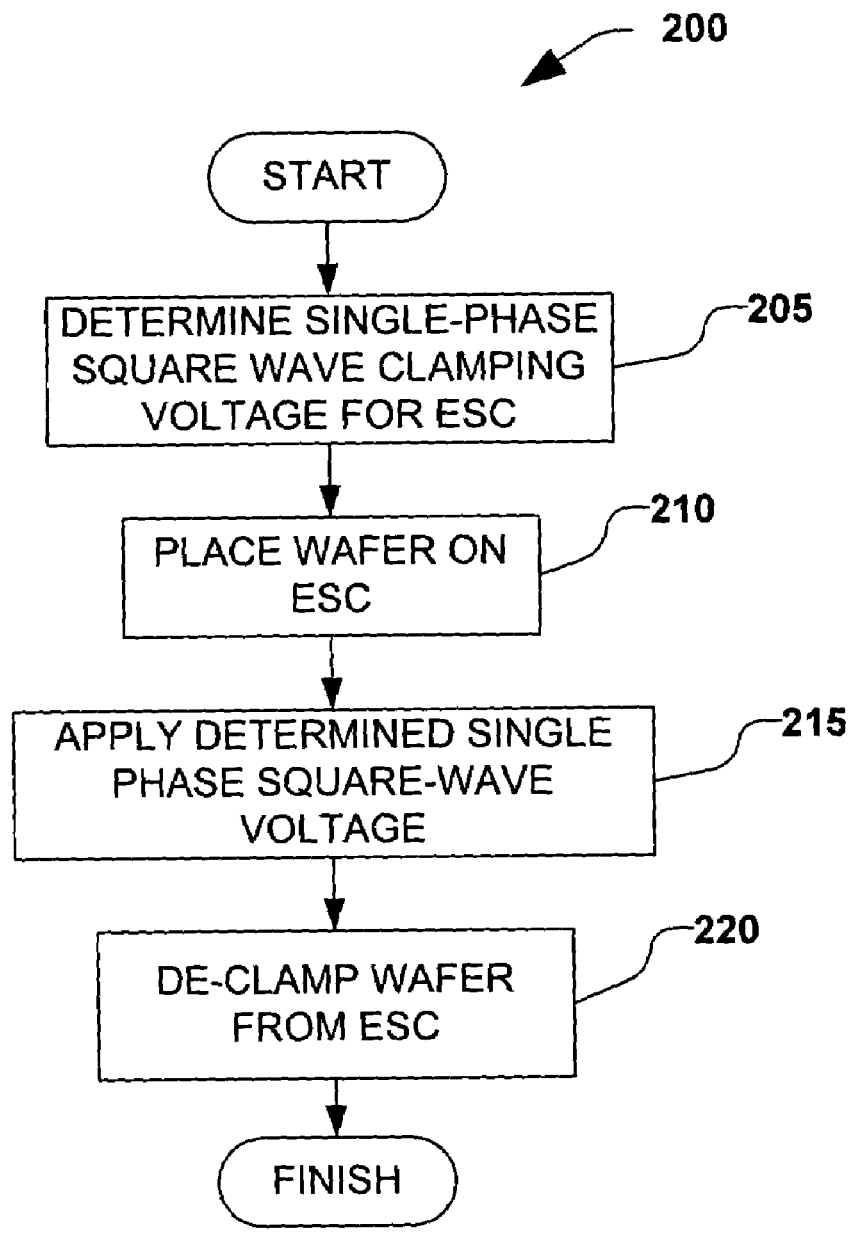
FIG. 8 illustrates an exemplary method for clamping and declamping a wafer according to another exemplary aspect of the present invention.

Referring now to FIG. 8, a method 200 for clamping a semiconductor wafer to a J-R electrostatic chuck is illustrated in accordance with one exemplary aspect of the present invention. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Beginning with act 205, a single-phase square wave clamping voltage is determined, based, at least in part, on a surface topography of the ESC. The surface topography of the ESC, for example, is defined by a surface topography of a leaky dielectric layer associated therewith. The clamping voltage may further be determined based on a minimum residual clamping force associated with the wafer and the electrostatic chuck.

In act 210, the wafer is placed on the leaky dielectric layer. The surface, for example, may comprise a roughened surface of the leaky dielectric layer, or a micro-machined leaky dielectric layer surface comprising a plurality of microstructures or islands extending from the dielectric surface. In act 215, the determined single-phase square wave clamping voltage is applied to the ESC, wherein the wafer is generally clamped to the ESC. The determined clamping voltage, for example, is operable to generally induce an electrostatic force between the ESC and the wafer, therein generally attracting the wafer to the surface of the ESC. For example, at least the minimum residual clamping force is maintained during a polarity switch of the applied single-phase square wave clamping voltage, wherein the wafer remains clamped to the electrostatic chuck, but wherein electrostatic charge is significantly prevented from migrating onto or accumulating on an insulating layer of the wafer.

In act 220, for example, the single-phase square wave clamping voltage is stopped, therein de-clamping the wafer from the ESC. The de-clamping time, for example, is further minimized due to the clamping voltage determination performed in act 205.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for clamping a semiconductor wafer having a backside insulator to a J-R electrostatic chuck having a leaky dielectric layer, the method comprising:
    determining a single-phase square wave clamping voltage for the electrostatic chuck, wherein the determination is based, at least in part, on a minimum residual clamping force associated with the wafer and the electrostatic chuck and a surface topography of the leaky dielectric layer;
    placing the wafer on the electrostatic chuck; and
    applying the determined single-phase square wave clamping voltage to the electrostatic chuck, therein electrostatically clamping the wafer to the electrostatic chuck, wherein at least the minimum residual clamping force is maintained during a polarity switch of the single-phase square wave clamping voltage, wherein the wafer remains clamped to the electrostatic chuck.

2. The method of claim 1, wherein the surface topography of the leaky dielectric layer comprises a first gap and a second gap between the wafer and the electrostatic chuck, wherein an RC time constant is associated with the respective first gap and second gap, and wherein a difference between the RC time constant associated with the respective first gap and second gap is such that at least the minimum residual clamping force is maintained during the polarity switch of the determined single-phase square wave clamping voltage.

3. The method of claim 2, wherein the second gap is associated with a natural surface roughness of the leaky dielectric layer, and wherein the first gap is larger than the second gap.

4. The method of claim 3, wherein the first gap is at least twice as large as the second gap.

5. The method of claim 3, wherein the first gap is at least three times as large as the second gap.

6. The method of claim 5, wherein the first gap is approximately 4 microns, and wherein the second gap is approximately 1 micron.

7. The method of claim 3, wherein the first gap is formed into the leaky dielectric layer by conventional machining or micro-machining the leaky dielectric layer.

8. The method of claim 2, wherein determining the single-phase square wave clamping voltage comprises determining a waveform defined by a pulse width and a pulse magnitude, wherein the waveform is a function the RC time constant associated with the respective first gap and second gap.

9. The method of claim 8, wherein the pulse magnitude is determined such that at least the minimum residual clamping force is provided between the wafer and the electrostatic chuck.

10. The method of claim 8, wherein the pulse magnitude of the determined single-phase square-wave clamping voltage is approximately less than +/−300 volts.

11. The method of claim 8, further comprising stopping the determined single-phase square wave clamping voltage, therein de-clamping the wafer from the electrostatic chuck, wherein a de-clamping time is associated with the pulse width of the determined waveform.

12. The method of claim 11, wherein the pulse width of the determined waveform is shorter than a required de-clamping time which satisfies process throughput specifications.

13. The method of claim 11, wherein the pulse of the determined waveform is less than approximately 1 second.

14. The method of claim 1, further comprising determining the surface topography of the leaky dielectric layer.

15. The method of claim 14, wherein determining the surface topography comprises determining one or more of an island height and an island area ratio.

16. The method of claim 1, further comprising applying a cooling gas backpressure to a backside of the wafer through the electrostatic chuck, wherein the determined single-phase square wave clamping voltage is further determined based on the cooling gas backpressure.

17. A system for clamping a wafer having a backside insulator, the system comprising:
- a J-R electrostatic chuck comprising a leaky dielectric layer and one or more electrodes operable to provide an electrostatic clamping force between the leaky dielectric layer and the wafer, the leaky dielectric layer having a plurality of islands extending from a surface thereof, whereon the wafer resides, wherein a first gap is defined between the surface of the dielectric layer and the wafer, and a second gap is defined between a top surface of the plurality of islands and the wafer, wherein the first gap and the second gap, in conjunction with the leaky dielectric layer, further define a respective RC time constant associated therewith; and
- a power supply configured to provide a single-phase square wave clamping voltage to the one or more electrodes, wherein a pulse magnitude of the single-phase square wave clamping voltage is associated with the RC time constant of the respective first gap and the second gap, and wherein the J-R electrostatic chuck is operable to maintain a minimum residual clamping force during a polarity switch of the single-phase square wave clamping voltage due, at least in part, to the respective RC time constants.

18. The system of claim 17, wherein the second gap is defined by a natural surface roughness of the leaky dielectric layer.

19. The system of claim 18, wherein the natural surface roughness of the leaky dielectric layer is approximately 1 micron or less.

20. The system of claim 17, wherein the first gap is at least twice as large as the second gap.

21. The system of claim 17, wherein the first gap is at least three times as large as the second gap.

22. The system of claim 17, wherein the first gap is approximately 4 microns, and wherein the second gap is approximately 1 micron.

23. The system of claim 17, wherein the plurality of islands are formed by one or more of conventionally machining and micro-machining the leaky dielectric layer, wherein a portion of the leaky dielectric layer is removed, therein defining the first gap between the wafer and the surface of the leaky dielectric layer.

24. The system of claim 23, wherein the plurality of islands are formed by bead blasting the leaky dielectric layer.

25. The system of claim 17, wherein a pulse magnitude of the single-phase square wave clamping voltage is operable to provide at least the minimum residual clamping force to the wafer.

26. The system of claim 17, wherein a pulse width of the single-phase square wave clamping voltage is shorter than a required de-clamping time which satisfies process throughput specifications.

27. The system of claim 17, further comprising a cooling gas supply, wherein the cooling gas supply is operable to provide a cooling gas backpressure between the electrostatic chuck and the wafer, and wherein the cooling gas backpressure is further associated with the minimum residual clamping force.

* * * * *